United States Patent
Steinhagen

(10) Patent No.: US 6,359,496 B1
(45) Date of Patent: Mar. 19, 2002

(54) ANALOG SWITCH INCLUDING TWO COMPLEMENTARY MOS FIELD-EFFECT TRANSITORS

(75) Inventor: Wolfgang Steinhagen, Mauern (DE)

(73) Assignee: Texas Instruments Deutschland, GmbH, Freising (DE)

( * ) Notice: Subject to any disclaimer, the term of this patent is extended or adjusted under 35 U.S.C. 154(b) by 0 days.

(21) Appl. No.: 09/711,774

(22) Filed: Nov. 13, 2000

(30) Foreign Application Priority Data

Nov. 11, 1999 (DE) ......................................... 199 54 329

(51) Int. Cl.⁷ .............................................. H03K 17/16
(52) U.S. Cl. ........................ 327/391; 327/389; 327/384
(58) Field of Search ................................. 327/374, 376, 327/377, 419, 379, 382, 384, 389, 391; 326/21, 23, 24, 25, 26, 27

(56) References Cited

U.S. PATENT DOCUMENTS

| | | | |
|---|---|---|---|
| 4,446,390 A | 5/1984 | Alaspa | 327/391 |
| 5,448,181 A * | 9/1995 | Chiang | 326/27 |
| 5,506,528 A * | 4/1996 | Cao et al. | 327/108 |
| 5,812,002 A * | 9/1998 | Yoshida | 327/210 |
| 5,933,046 A | 8/1999 | Ramat | 327/534 |

FOREIGN PATENT DOCUMENTS

JP  06169247 A  6/1994

* cited by examiner

*Primary Examiner*—Tuan T. Lam
*Assistant Examiner*—Hiep Nguyen
(74) *Attorney, Agent, or Firm*—Frederick J. Telecky, Jr.; William B. Kempler

(57) ABSTRACT

An analog switch includes two complementary MOS field-effect transitors (10, 12) whose source-drain circuits are located in parallel between the input terminal (18) and the output terminal (20) of the switch. A control signal for controlling the switch is applied to the gate of the MOS field-effect transistor (12) of the one channel type directly and to the gate of the MOS field-effect transistor (10) of the other channel type via a negator (16). Between the input terminal (18) and output terminal (20) of the switch the series source-drain circuits of three MOS field-effect transistors (22, 24, 26) are inserted, whereby the MOS field-effect transistor (24) located in the middle of the series circuit has a channel type opposite that of the other two MOS field-effect transistors (22, 26). The gates of all MOS field-effect transistors of the other channel type are each interconnected. The threshold voltages of the three MOS field-effect transistors (22, 24, 26) of the series circuit are lower than the threshold voltages of the two complementary MOS field-effect transistors (10, 12) whose source-drain circuits are connected in parallel.

1 Claim, 1 Drawing Sheet

Figure 1:
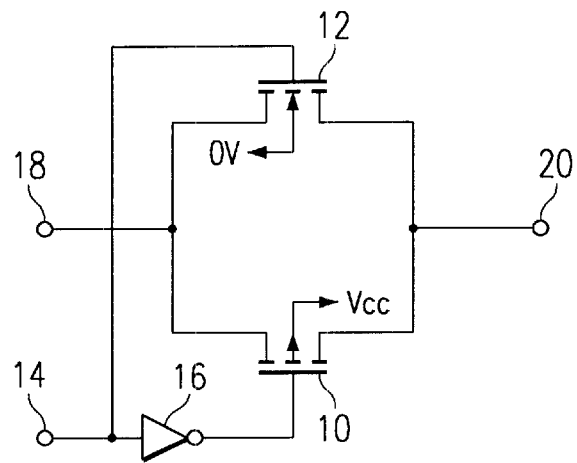

ANALOG SWITCH INCLUDING TWO COMPLEMENTARY MOS FIELD-EFFECT TRANSITORS

BACKGROUND OF THE INVENTION

The invention relates to an analog switch including two complementary MOS field-effect transitors whose source-drain circuits are located in parallel between the input terminal and the output terminal of the switch, a control signal for controlling the switch being applicable to the gate of the MOS field-effect transistor of the one channel type directly and to the gate of the MOS field-effect transistor of the other channel type via a negator.

An analog switch of this kind, also termed transfer gate in prior art, is known from the German text book on high-frequency circuitry, "Taschenbuch der Hochfrequenztechnik" by Meinke & Gundlach, 5th Edition, page M35. FIG. 1 shows the circuit diagram of one such known analog switch.

This known analog switch 10 as shown in FIG. 1 contains two complementary MOS field-effect transitors, namely a P-channel field-effect transistor 10 and an N-channel field-effect transistor 12. Signalling the two field-effect transistors 10 and 12 opposite in phase as needed is achieved by applying the control signal from the control signal terminal 14 used for controlling the switch to the gate of the N-channel MOS field-effect transistor 12 directly and to the gate of the P-channel MOS field-effect transistor 10 via a negator 16. To set the switch into the other active state in which a connection between the input terminal 18 and the output terminal 220 exists a HI potential signal, having namely the potential of the supply voltage Vcc, is applied to the control signal terminal 14, signalling both field-effect transistors 10 and 12 ON; whereas when a LO potential signal, having namely ground potential, is applied to the control signal terminal 14, both field-effect transistors 10 and 12 are signalled OFF in which no connection exists between the input terminal 18 and the output terminal 20.

As dictated by the CMOS technology typical for production of the complementary field-effect transistors 10 and 12 both these field-effect transistors comprise a threshold voltage of approx. 1V. This threshold voltage is the potential which relative to the source of the corresponding transistor needs to be applied to the gate so that this transistor changes from the OFF condition into the ON condition, meaning in other words that in this condition the insulation resistance of the transistor assumes very low values; whereas the insulation resistance of the field-effect transistors becomes very high when the supply voltage Vcc, applied as the control signal to the control signal terminal 14, approaches the sum of the two threshold voltages of the field-effect transistors 10 and 12. When only a relatively low supply voltage is available, this may result in it no longer being possible to signal the field-effect transistors 10 and 12 ON so that the analog switch is no longer able to function as desired. One solution to this problem of the field-effect transistors no longer being signalled ON at low supply voltages would be to make use of field-effect transistors which due to application of another CMOS production process have a substantially lower threshold voltage. Such field-effect transistors can be produced with a threshold voltage in the region of 0V. However, when using such field-effect transistors there is likewise the problem that it may then no longer be possible to signal them totally OFF because the threshold voltage due to its temperature dependency is below the control signal voltage normally put to use for this purpose. The result of this is an undesirably high leakage current flowing in the inactive condition of the switch.

SUMMARY OF THE INVENTION

An object of the invention is configuring an analog switch of the aforementioned kind so that it can be reliably switched ON/OFF even at low supply voltages with only a negligable leakage current flowing in the OFF condition.

This object is achieved in accordance with one aspect of the invention by a switch of the aforementioned kind in accordance with the invention in that between the input terminal and output terminal of the switch the series source-drain circuits of three MOS field-effect transistors are inserted, whereby the MOS field-effect transistor located in the middle of the series circuit has a channel type opposite that of the other two MOS field-effect transistors, that the gates of all MOS field-effect transistors of the other channel type are each interconnected and that the threshold voltages of the three MOS field-effect transistors of the series circuit are lower than the threshold voltages of the two complementary MOS field-effect transitors whose source-drain circuits are connected in parallel.

This combination of MOS field-effect transistors having a high threshold voltage and MOS field-effect transistors having a low threshold voltage now achieves that the analog switch can be reliably signalled OPEN (field-effect transistors OFF) and CLOSED (field-effect transistors ON) even when the supply voltage is low.

BRIEF DESCRIPTION OF THE DRAWINGS

One example embodiment of the invention will now be detained with reference to the drawing in which FIG. 1 is a single-line diagram of a prior art analog switch and FIG. 2 is a single-line diagram of the analog switch configured in accordance with the invention.

DETAILED DESCRIPTION

Referring now to FIG. 2 there is illustrated the analog switch as described in the following, containing in addition to the complementary MOS field-effect transitors 10 and 12, likewise contained in the prior art analog switch as shown in FIG. 1, three further MOS field-effect transistors 22, 24 and 26. It is to be noted in this case that the field-effect transistors 10 and 24 are P-channel field-effect transistors whilst the field-effect transistors 12, 22 and 26 are N-channel field-effect transistors.

The field-effect transistors 10 and 12 have a threshold voltage in the region of 1V, whilst the field-effect transistors 22, 24 and 26 have a substantially lower threshold voltage in the region of 0V due to application of a special CMOS production process. As readily evident, the gates of the field-effect transistors of the same channel type, i.e. the field-effect transistors 10 and 24, on the one hand, and the field-effect transistors 12, 22 and 26, on the other, are interconnected. This means that the gates of the field-effect transistors 10 and 12 receive the control signal applied to the control signal terminal 14 via the negator 16 whilst the gates of the field-effect transistors 12, 22 and 22 receive this control signal directly, i.e. not negated.

The function of the analog switch as shown in FIG 2 will now be detailed.

When a control signal having a voltage corresponding to the supply voltage Vcc is applied to the control signal terminal 14, then the field-effect transistors 12, 22 and 26 whose gates are directly connected to the control signal terminal 14 are signalled ON since these field-effect transistors, as mentioned above, are P-channel field-effect transistors. The control signal is negated by the negator 16 so that a LO signal, i.e. having ground potential, appears at the gates of the field-effect transistors 10 and 24, resulting in these field-effect transistors too being signalled ON since these field-effect transistors are N-channel field-effect transistors. Accordingly, all field-effect transistors are ON, resulting in a connection existing between the input terminal 18 and output terminal 20 of the switch, the analog switch thus being closed.

When, instead, a LO signal, corresponding to the ground potential, is applied to the control signal terminal 14, then all transistors are signalled OFF so that no conducting connection exists between the input terminal and output terminal of the switch, i.e. the switch being open.

Figure 2:
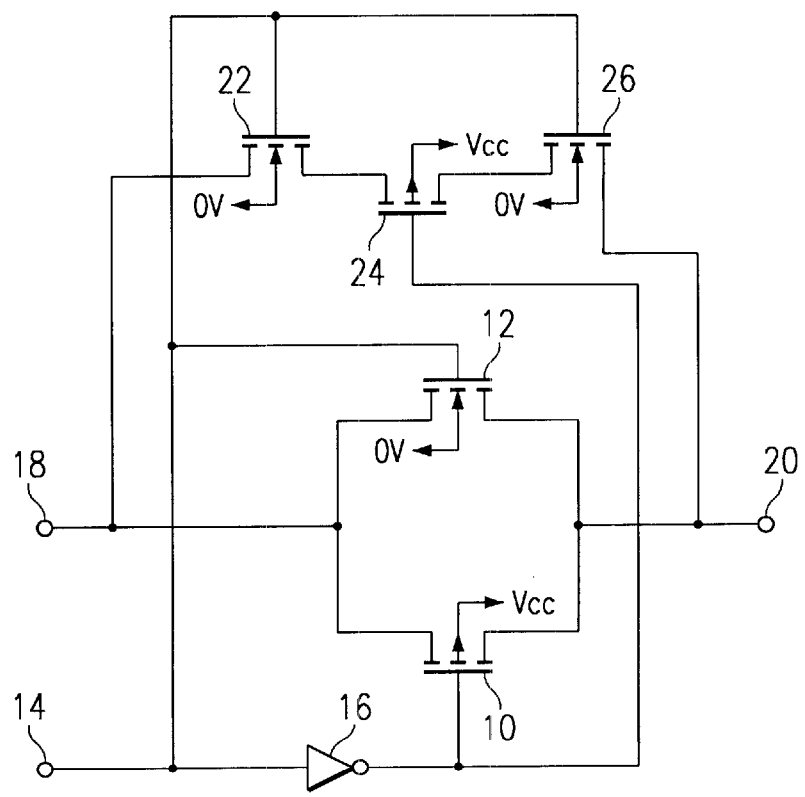

This response of the analog switch as shown in FIG. 2 is also evident when the supply voltage Vcc and thus the HI level of the control signal appliable to the control signal terminal 14 approaches twice the potential of the threshold voltage of the field-effect transistors 10 and 12. When the control signal has such a low potential the field-effect transistors 10 and 12 can no longer be signalled ON, but in this case the field-effect transistors 22, 24 and 26, whose threshold voltage is lower than that of the field-effect transistors 10 and 12 and is in the region of 0V, generate the signal needed to produce a conducting connection between the input terminal 18 and output terminal 20 of the switch when the HI control signal is applied to the control signal terminal; whereas if the analog switch is to be opened, i.e. to open the conducting connection between the input terminal 18 and output terminal 20 of the switch, this can be achieved by applying the low potential to the control signal terminal 14. In this condition either a negative gate-source voltage is applied to the gates of the N-channel field-effect transistors 12, 22 and 26 or a positive gate-source voltage is applied to the gates of the F-channel field-effect transistors 10 and 24, resulting in these field-effect transistors being signalled OFF. This applies also when the threshold voltages of the field-effect transistors 22, 24 and 26 fluctuate due to changes in temperature, so that in the OPEN condition of the analog switch there is now no appreciable flow of leakage current.

By inserting the MOS field-effect transistors 22, 24 and 26 having a lower threshold voltage than the MOS field-effect transistors 10 and 12 an analog switch can thus be achieved which despite its simple configuration can still be relatiably signalled ON/OFF even when the supply voltage available is low.

It will be appreciated that although the channel type of the corresponding MOS field-effect transistor's has been stipulated in each case in the above description, the analog switch will work just as well when the channel-types are swapped, i.e. employing an N-channel field-effect transistor instead of a P-channel field-effect transistor in each case.

What is claimed is:

1. An analog switch comprising two complementary MOS field-effect transistors having source-drain circuits located in parallel between an input terminal and an output terminal of the switch, a control signal for controlling the switch being applied to the gate of the MOS field-effect transistor of the one channel type directly and to the gate of the MOS field-effect transistor of the other channel type via an inverter, a series of source-drain circuits of three MOS field-effect transistors (22, 24, 26) are inserted between the input terminal (18) and the output terminal (20) of the switch, whereby the MOS field-effect transistor (24) located in the middle of the series circuit has a channel type opposite that of the other two MOS field-effect transistors (22, 26), wherein the gates of all MOS field-effect transistors of the other channel type are each interconnected and that the threshold voltages of the three MOS field-effect transistors (22, 24, 26) of the series circuit are lower than the threshold voltages of the two complementary MOS field-effect transistors (10, 12) whose source-drain circuits are connected in parallel.

\* \* \* \* \*